(12) United States Patent
Lee et al.

(10) Patent No.: US 10,479,676 B2
(45) Date of Patent: Nov. 19, 2019

(54) APPARATUS AND METHODS FOR INTEGRATED MEMS DEVICES

(71) Applicant: mCube, Inc., San Jose, CA (US)

(72) Inventors: Ben Lee, San Jose, CA (US); Ming Hong Kuo, San Jose, CA (US); Wen-Chih Chen, San Jose, CA (US); Wensen Tsai, San Jose, CA (US)

(73) Assignee: mCube, Inc., San Jose, CA (US)

( * ) Notice: Subject to any disclaimer, the term of this patent is extended or adjusted under 35 U.S.C. 154(b) by 0 days.

(21) Appl. No.: 16/102,592

(22) Filed: Aug. 13, 2018

(65) Prior Publication Data

US 2018/0346328 A1    Dec. 6, 2018

Related U.S. Application Data

(62) Division of application No. 15/479,154, filed on Apr. 4, 2017, now Pat. No. 10,046,966.
(Continued)

(51) Int. Cl.
*G01R 31/02*    (2006.01)
*B81C 99/00*    (2010.01)
(Continued)

(52) U.S. Cl.
CPC ........ *B81C 99/0045* (2013.01); *B81C 99/005* (2013.01); *G01R 1/0433* (2013.01); *G01R 31/2607* (2013.01); *H01L 21/67132* (2013.01)

(58) Field of Classification Search
CPC ........ H01L 21/67132; G01R 31/31702; G01R 31/26; G01R 31/2607; G01R 31/02;
(Continued)

(56) References Cited

U.S. PATENT DOCUMENTS 8,896,336 B2 * 11/2014 Eldridge ............ G01R 31/2889
  324/756.03
2007/0063721 A1    3/2007 Dozier, II et al.
(Continued)

FOREIGN PATENT DOCUMENTS

WO    2015070135 A2    5/2015

OTHER PUBLICATIONS

International Search Report for application No. PCT/US2017/025992, dated Jul. 11, 2017.

*Primary Examiner* — Chuong A Luu
(74) *Attorney, Agent, or Firm* — Richard T. Ogawa; Ogawa P.C.

(57) ABSTRACT

A method for a MEMS device includes receiving a diced wafer having a plurality devices disposed upon an adhesive substrate and having an associated known good device data, removing a first set of devices from the plurality of devices from the adhesive substrate in response to the known good device data, picking and placing a first set of the devices into a plurality of sockets within a testing platform, testing the first set of integrated devices includes while physically stressing the first set of devices, providing electrical power to the first set of devices and receiving electrical response data from the first set of devices, determining a second set of devices from the first set of devices, in response to the electrical response data, picking and placing the second set of devices into a transport tape media.

10 Claims, 6 Drawing Sheets

Related U.S. Application Data

(60) Provisional application No. 62/318,142, filed on Apr. 4, 2016.

(51) Int. Cl.
  *G01R 1/04* (2006.01)
  *G01R 31/26* (2014.01)
  *H01L 21/67* (2006.01)

(58) Field of Classification Search
  CPC .. G01R 31/20; G01R 31/28; G01R 31/31705; G01R 31/31707; G01R 31/31715; G01R 31/318505; G01R 31/2893; G01R 31/2868; G01R 1/0433; G01R 1/04; B81C 99/00; B81C 99/005; B81C 99/0045
  USPC ...................................... 438/14, 25
  See application file for complete search history.

(56) References Cited

U.S. PATENT DOCUMENTS

| | | | |
|---|---|---|---|
| 2008/0252330 A1 | 10/2008 | Hart et al. | |
| 2010/0109699 A1 | 5/2010 | Anderson et al. | |
| 2014/0356989 A1 | 12/2014 | Chen et al. | |
| 2015/0077152 A1* | 3/2015 | Murata | G01R 31/2889 324/756.03 |

* cited by examiner

APPARATUS AND METHODS FOR INTEGRATED MEMS DEVICES

CROSS-REFERENCE TO RELATED APPLICATIONS

The present invention is a divisional of and claims priority to U.S. application Ser. No. 15/479,154 filed Apr. 4, 2017 (now U.S. Pat. No. 10046966 issued Aug. 14, 2018), which is a non-provisional of U.S. patent application Ser. No. 62/318,142 filed Apr. 4, 2016. These applications are herein by incorporated by reference in their entirety, for all purposes.

BACKGROUND

The present invention relates to integrated circuit production. More specifically, the present invention relates to a method for testing and packaging of integrated MEMS circuits having CMOS and MEMS devices.

The inventors have discovered that when the integrated MEMS devices are equal to or smaller than about 1.6 mm×1.6 mm, such 1.1 mm×1.1 mm, or the like, handing of them using conventional methods is difficult and can be damaging to the parts. For instance, the inventors have discovered that electrostatic forces make it difficult to separate, properly orient, and package MEMS devices at such small scales. Further, the inventors have discovered that pick and place machines, air puffs and sorting units can impart high forces upon the devices and physically damage the MEMS devices at such scales.

What is desired are improved methods and apparatus for handling MEMS with reduced drawbacks.

SUMMARY

The present invention relates to MEMS production. More specifically, the present invention relates to a method for testing and packaging of MEMS devices.

Embodiments of the present invention disclose methods for testing and packing MEMS devices including: receiving a diced wafer having singulated MEMS dies secured upon an adhesive backing; removing known good dies from the adhesive backing and mounting the MEMS dies upon a rate table; testing the MEMS dies by providing power to the dies: manipulating the dies with the rate table and sensing responsive data from the MEMS dies; removing MEMS dies from the rate table; and placing MEMS dies that pass the tests into a tape transport media.

Embodiments of the present invention disclose apparatus for testing and packing MEMS devices including: a receiving stage for receiving a diced wafer having singulated MEMS dies secured upon an adhesive backing; a pick and place device for removing known good dies from the adhesive backing and mounting the MEMS dies upon a rate table; a testing unit for testing the MEMS dies including a power source for providing power to the dies, a rate table for manipulating the MEMS dies, and sensors for receiving responsive data from the MEMS dies; a processing unit for determining which MEMS dies pass the tests using the responsive data; and a pick and place device for removing the MEMS dies from the rate table and for placing MEMS dies that pass the tests into a tape transport media.

According to one aspect of the invention, a system for a plurality of integrated devices comprising CMOS and MEMS devices is disclosed. One apparatus includes a receiving stage configured to receive a diced wafer comprising the plurality of integrated devices disposed upon an adhesive substrate, wherein the diced wafer is associated with a known good device data associated with the plurality of integrated devices and a reel and tape packaging stage configured to receive and seal a first set of integrated devices from the plurality of integrated devices into a transport tape media, and configured to wind the transport tape media upon a reel. A system may include a testing stage coupled to a receiving stage and to a reel and tape packaging stage including a testing platform comprising a plurality of sockets, wherein each socket from the plurality of sockets is configured to releasably secure an integrated device from the plurality of integrated devices and configured to provide electrical power to the integrated device and to receive electrical response data from the integrated device during a testing phase, and wherein the testing platform is configured to physically stress the integrated device during the testing phase. A testing stage may include a first pick and place device coupled to a testing platform and to a receiving stage, wherein the first pick and place device is configured to remove a second set of integrated devices from a plurality of integrated devices from the adhesive substrate in response to the known good device data, and wherein the first pick and place device is configured to dispose the second set of integrated devices into the plurality of sockets, and a second pick and place device coupled to the testing platform and to a reel and tape packaging stage, wherein the second pick and place device is configured to remove the second set of integrated devices from the testing platform, and wherein the second pick and place device is configured to dispose a first set of integrated devices into the transport tape media of the reel and tape packaging stage in response to electrical response data from integrated devices from the second set of integrated devices.

According to another aspect of the invention, a testing method is disclosed. One technique includes receiving in a receiving stage, a diced wafer having a plurality of integrated devices comprising CMOS and MEMS devices disposed upon an adhesive substrate, wherein the diced wafer is associated with a known good device data associated with the plurality of integrated devices, removing with a first pick and place device, a first set of integrated devices from the plurality of integrated devices from the adhesive substrate in response to the known good device data, and placing with the first pick and place device, the first set of integrated devices into a plurality of sockets within a socket substrate. A process may include testing with the testing platform, a first set of integrated devices comprising: while physically stressing with the testing platform, the first set of integrated devices, providing with the plurality of sockets, electrical power to the first set of integrated devices and receiving with the plurality of sockets, electrical response data from the first set of integrated devices. A method may include determining with a processing unit coupled to a testing platform, a second set of integrated devices from a first set of integrated devices, in response to electrical response data, removing with a second pick and place device, the second set of integrated devices from a plurality of sockets within the socket substrate, and disposing the second set of integrated devices into a transport tape media.

In various embodiments, singulated MEMS devices are equal to or smaller than about 1.6 mm×1.6 mm, such 1.1 mm×1.1 mm, or the like.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION

Figure 1:
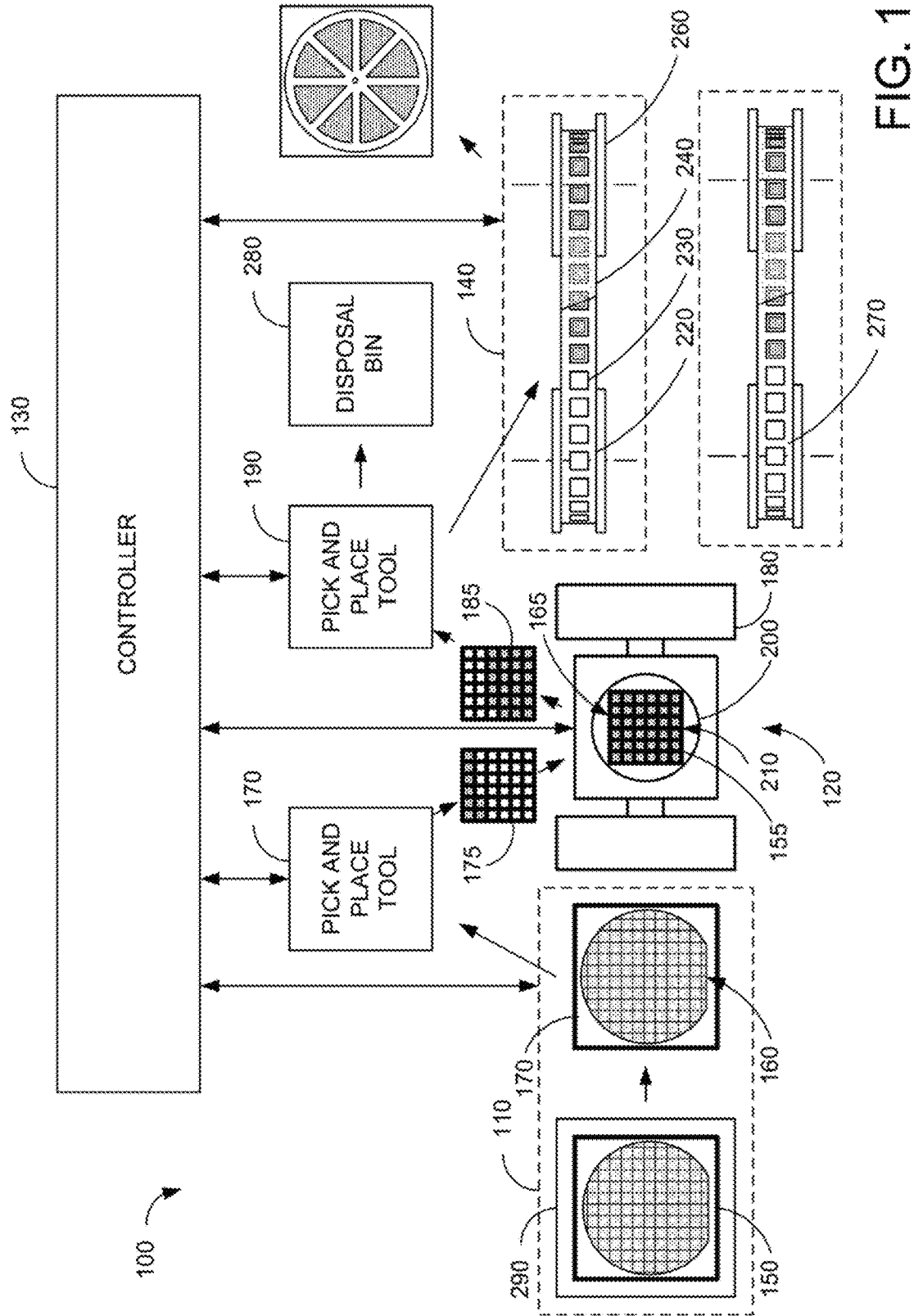
FIG. 1 illustrates a block diagram of an embodiment of the present invention.

FIG. 1 illustrates a block diagram of an embodiment of the present invention. More specifically, FIG. 1 illustrates a system 100 for testing and packaging integrated devices. In various embodiments, the integrated devices comprise CMOS and MEMS portions. As can be seen in FIG. 1, system 100 includes a receiving station 110, a testing station 120, a controller 130 and a reel and tape packaging station 140.

In various embodiments, receiving station 110 receives one or more diced wafers 150, each including singulated devices 160 disposed upon an adhesive backing material 170 (e.g. blue tape). In some embodiments, singulated devices are equal to or smaller than about 1.6 mm×1.6 mm, such 1.1 mm×1.1 mm, or the like. Singulated devices 160 are typically encapsulated and have a number of contact regions exposed through the encapsulation. In various embodiments, encapsulation may be performed before or after singulating or dicing. Typically, each of the singulated devices 160 are electronically tested, and singulated devices 160 that pass these tests are included in a known good device data file or the like. In various embodiments, the electronic tests involve the static testing of the CMOS portion and the MEMS portion of the integrated devices, whereas the tests described below involve dynamic testing of the CMOS and MEMS portions of the integrated devices.

In various embodiments, testing station 120 is coupled to receiving station 110. As can be seen in FIG. 1, testing station 120 may include a first pick and place tool 170, a rate table 180 and a second pick and place tool 190. In various embodiments, rate table 180 typically includes a test platform 200 and multiple sockets 210 in a socket substrate 155.

In various embodiments, first pick and place tool 170 may include a first pick and place arm that is adapted to remove singulated devices 160 from adhesive backing material 170, typically one at a time. Additionally, first pick and place tool 170 may include a second pick and place arm that is adapted to receive singulated devices 160 from the first pick and place arm and to place singulated devices 160 into sockets 210 of test platform 200 (singulated devices 165). In other embodiments, first pick and place device 170 may include a single arm that removes singulated devices 160 from adhesive backing material 170, and that places the singulated devices 160 into sockets 210, one at a time. In still another embodiment, first pick and place tool 170 may place singulated devices into sockets of socket substrate 175.

Sockets 210 are adapted to physical restrain singulated devices 165 into socket substrate 155, and socket substrate 155 may be removably coupled to test platform 200. In turn test platform 200 provides electrical power to the singulated devices 165 and to receive responsive electrical signals from singulated devices 165 during a testing phase. In one embodiment, multiple socket substrates, 155, 175 and 185, are provided within this system and are each is removably attachable to test platform 200 to allow for testing of singulated devices placed therein. According to some embodiments, test platform 200 may test singulated devices 165 disposed upon a first socket substrate (e.g. 155), while first pick and place device 170 loads singulated devices into a second socket substrate (e.g. 175), and while a second pick and place device 190 unloads singulated devices from a third socket substrate (e.g. 185). In other embodiments, only one socket substrate (e.g. 155) is provided and affixed to test platform 200.

In some embodiments, during the testing phase, rate table 180 induces physical stresses upon singulated devices 165, via test platform 200 and sockets 210. In some embodiments, the types of physical stresses include displacements in the x-axis, y-axis, z-axis, or various permutations thereof, e.g. shaking in the y-axis, shaking in the x-axis and z-axis, or the like. In some embodiments, the types of physical stresses include rotations in the x-axis, y-axis, z-axis, or various permutations thereof, e.g. rotating in the z-axis, rotating in the x-axis and y-axis, or the like. In still other embodiments, the above movements may be combined with the presence of a localized magnetic field or using the global magnetic field. The relative movement of singulated devices 160 to the magnetic fields may be used to test a one or multi-dimensional magnetometer. In further embodiments, rate table 180 may also be disposed within a vacuum or pressure chamber, with an oven or chilling unit, within a humidity chamber, or the like.

In various embodiments, second pick and place tool 190 includes a first arm adapted to remove tested singulated devices 165 from sockets 210 of socket substrate 155 of testing station 120. Additionally, a second arm of second pick and place tool 190 is adapted to receive singulated devices 165 from the first arm and is adapted to place or provide singulated devices 165 to reel and tape station 140. In other embodiments, a single arm removes tested singulated devices 165 from sockets and places various devices to reel and tape station 140. In additional embodiments, second pick and place tool 190 may be adapted to remove tested singulated devices from sockets of socket substrate 185 and place singulated devices to reel and tape station 140, using one or more pick and place arms. In still other embodiments, a single pick and place tool may take the place of first pick and place tool 170 and second pick and place tool 190 and provide the combined functionality described above.

In some embodiments of the present invention, reel and tape station 140 comprises a transport tape media 220 having a number of storage locations 230. Typically, transport tape media 220 is made of plastic, electrostatic safe material, or the like, and storage locations 230 comprise integrally molded indents within the transport tape media 220. In other embodiments, conventional transport tape materials may also be used herein. Storage locations 230 are adapted to receiving and holding singulated devices 165. As can be seen, a sealing tape 240 may be provided to secure singulated devices 165 within storage locations 230. In various embodiments, the sealed transport tape media is adapted to be wound upon a reel 260, and subsequently packaged (e.g. sealed electrostatic sleeve and cardboard box) for shipment. In some embodiments, transport tape media may be replaced with a transport tray media, e.g. a tray having electrostatic safe storage locations.

In various embodiments, two or more reels 260 may be provided for purposes of performance binning of components, or the like. For example, singulated devices 165 having performance characteristics greatly exceeding a threshold may be stored within a first reel 260, and singulated devices 165 having performance characteristics barely exceeding the threshold may be stored within a second reel 270. In some embodiments, more than two performance-based reels may be used (e.g. two bins); only a single bin (e.g. packaged within first reel 260) is used, and singulated devices not meeting the threshold characteristics may be discarded into a disposal bin 280.

FIG. 1 also illustrates a controller 130. In various embodiments, controller 130 may be variously coupled to receiving station 110, first and second pick and place machines 170 and 200, rate table 180, and reel and tape station 140. In some embodiments, controller 130 is adapted to receive the known good device data file associated with singulated devices 160 for a diced wafer 150. In response, controller 130 is adapted to instruct first pick and place tool 170 to pick out known good singulated devices from diced wafer 150 and to place these devices into sockets 210 of socket substrate 155 or socket substrate 175, as described above. In various embodiments, controller 130 is also adapted to direct the test platform 200 to perform functions during a testing phase. This may include writing of data to registers of singulated devices 165, providing a series of electrical signals of singulated devices, providing power to singulated devices 166, and receiving responsive data from singulated devices 165. This communication with singulated devices may be done via multiple sockets 210, via probes, or the like.

In various embodiments, controller 130 is also adapted to direct test platform 200 to physically stress singulated devices 165 within sockets 210. For example, controller 130 may direct rate table 180 to physical stress singulated devices 160, as was described above, including accelerating and/or rotating singulated devices 165; controller 130 may direct a pressure chamber to pressurize or the like; controller 130 may direct an oven to increase an oven temperature; and the like. In response to the responsive data from singulated devices 165, controller 130 is adapted to determine whether particular singulated devices 165 pass or fail performance tests, which performance bin to place particular singulated devices, destinations for singulated devices that were tested, and the like. Based upon such characterization data, controller 130 is adapted to direct second pick and place tool 190 to remove singulated devices 165 from sockets 210 of socket substrate 155 or socket substrate 185, and to place singulated devices in the appropriate destination. For example, controller 130 may instruct second pick and place tool 190 to place certain singulated devices 165 in a first tape media 220, a second tape media 270, in a discard bin 248, or the like.

In some embodiments, controller 130 may also be adapted to provide commands to tape and reel station 140. As an example, controller 130 may be adapted to instruct reel 260 to rotate or advance, after a singulated device is placed into tape transport tape media 220. In some embodiments, in response to such a command, sealing tape 240 may automatically seal the singulated device into reel 260; transport tape media 220 may automatically be wound upon reel 260; and the like. In various embodiments, prior to sealing-in the singulated device, transport tape media 220 should be held very still so as not to inadvertently reorient singulated devices 165 within the transport tape media 220. For example, in some embodiments, it is desired that all singulated devices are oriented in the same manner, e.g. contact locations are all face up and pin 1 is disposed within the upper right-most corner within a cavity of transport tape media 220). By doing so, subsequent placement of such singulated devices 165 from transport tape media onto different substrates is facilitated. In various embodiments, tape and reel station 140 or controller 130 may determine when transport tape media 220 is full, when reel 260 is full, or the like, and provide an indicator signal of the status to an operator. The indicator signal may be an electronic message to the operator (e.g. e-mail, text message, status message); an indicator light; a sound; or the like.

Figure 2A:
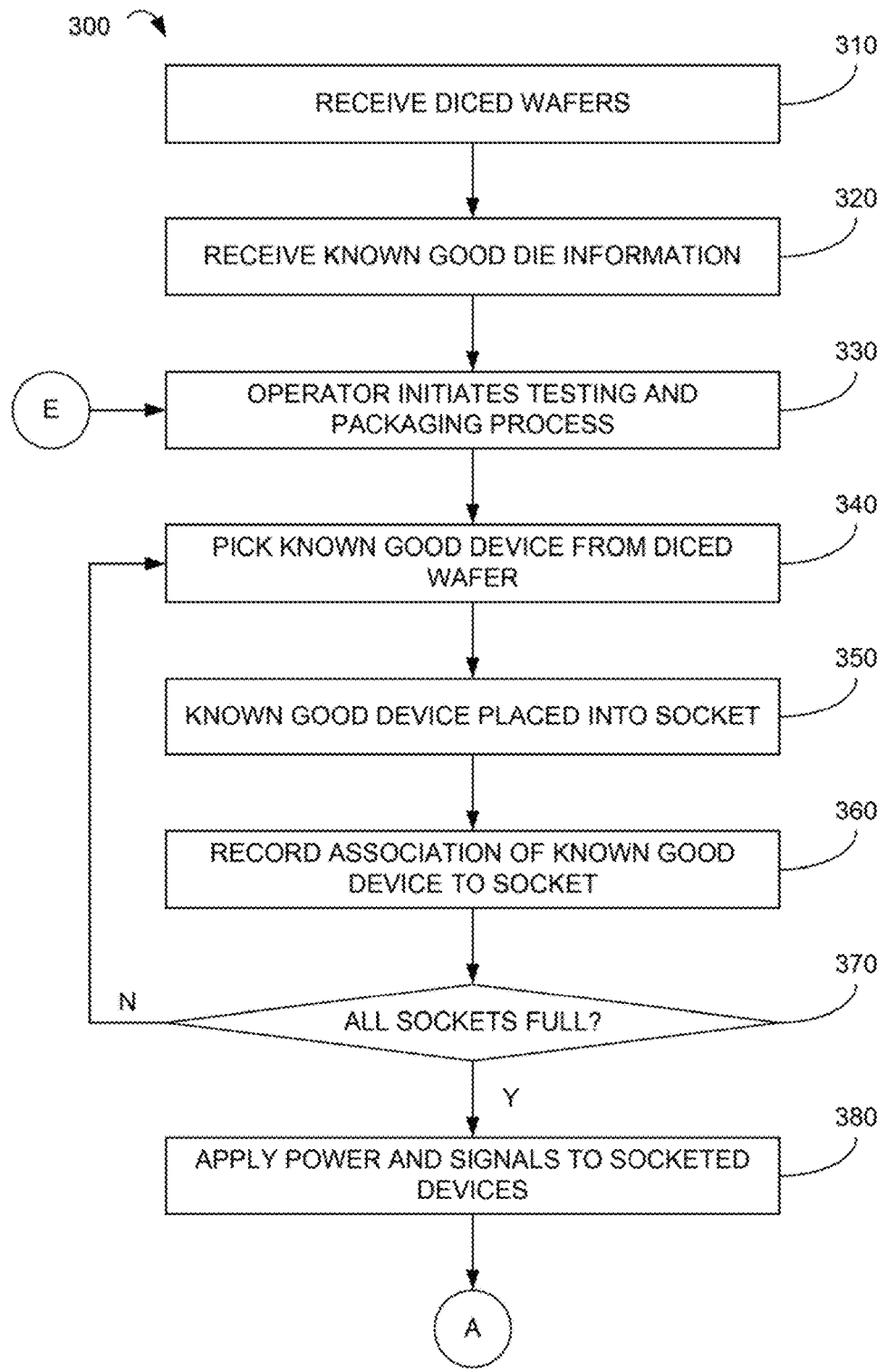
FIGS. 2A-C illustrate a flow diagram of methods according to various embodiments of the present invention.
Figure 2B:
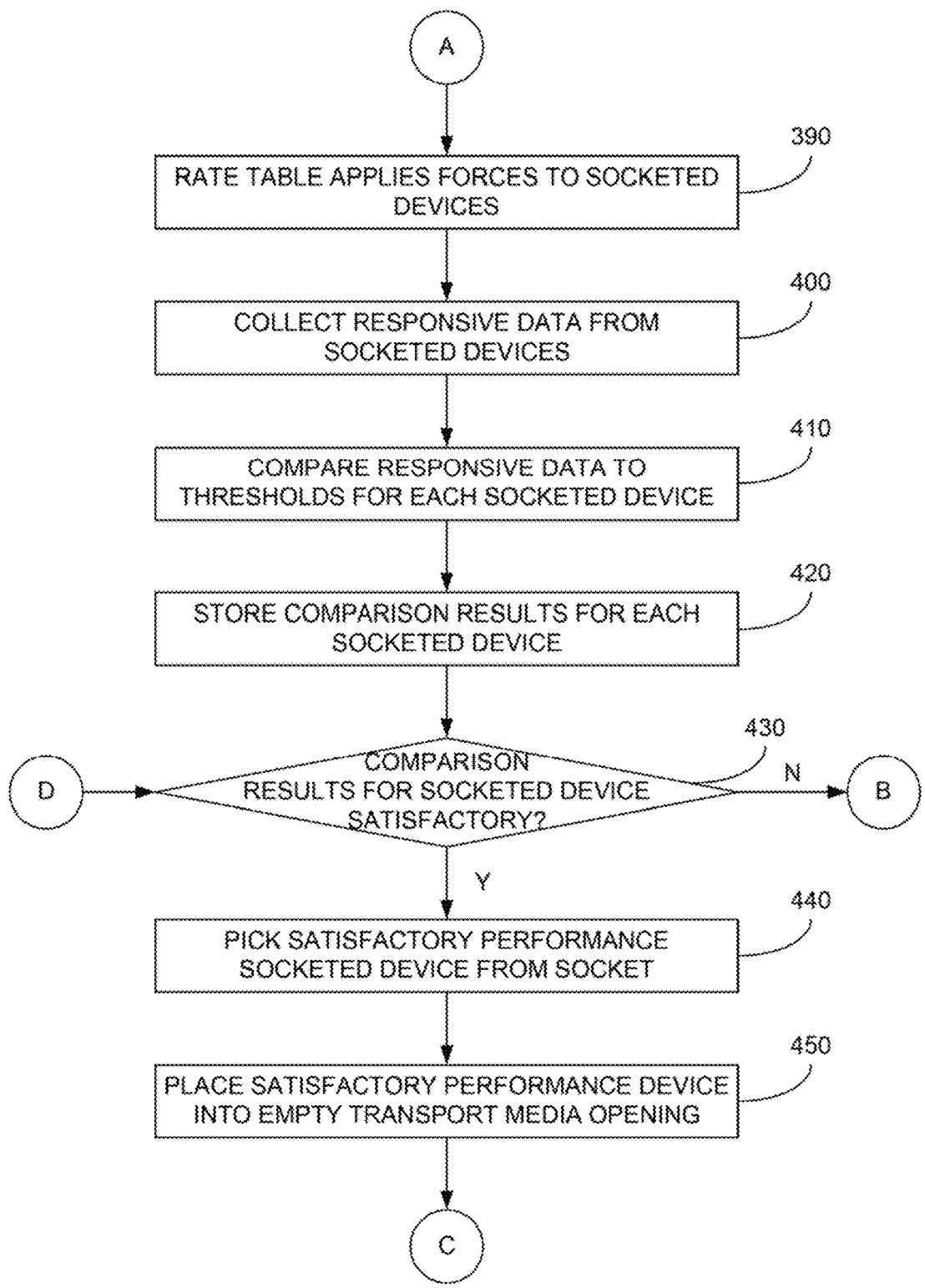
Figure 2C:
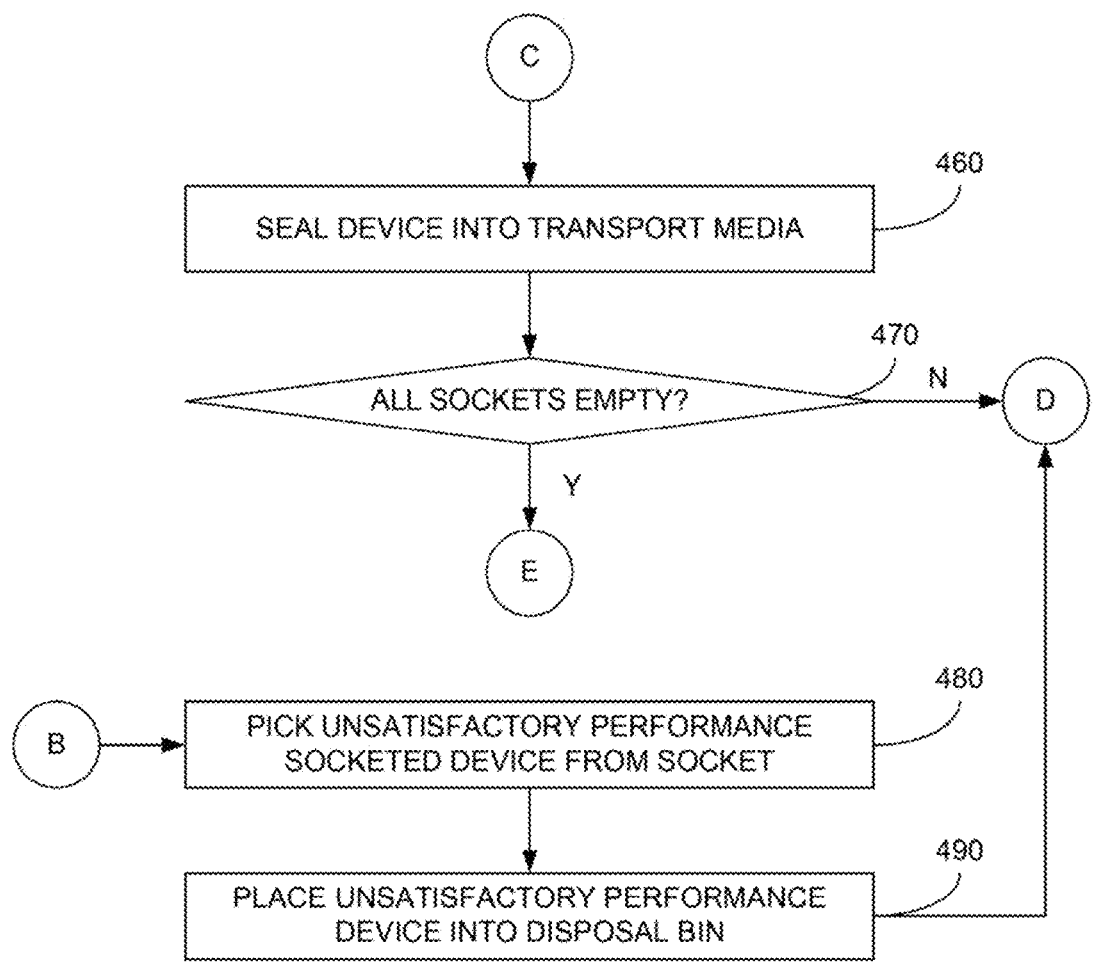

FIGS. 2A-C illustrate a flow diagram of methods according to various embodiments of the present invention. More particularly, FIGS. 2A-C illustrate a process 300 for operating a system similar to system 100 in FIG. 1. For sake of convenience, the process below will refer to elements of FIG. 1, although process 300 may apply to other embodiments of FIG. 1.

Initially, system 100 receives one or more diced wafers 150 within a holder or cassette 290 in receiving station 110, step 310. In various embodiments, diced wafers 150 may be stored on a horizontal or vertical storage cassette, or the like. Next, known good die information associated with each of diced wafers 150 may be provided to controller 130, step 320. As discussed above, each singulated devices 160 are typically subject to an initial set of tests, and singulated devices 160 that pass such tests are identified as a known good device. In other embodiments, singulated devices 160 that do not pass the initial set of tests may have a physical mark placed upon the packaging. Singulated devices 160 thus not having the physical mark may be deemed to be known good devices, or the like.

In various embodiments, an operator may initiate the testing of the singulated devices 160, step 330, via one or more graphical user interfaces provided by controller 130. For instance, the operator may select a menu command to direct controller 130 to perform the steps described below.

In response to a command from controller 130, first pick and place tool 170 typically picks up a known good singulated device from the adhesive backing material 170 of a diced wafer 150, step 340. Subsequently, controller 130 instructs first pick and place tool 170 to place the singulated device into an open socket (from multiple sockets 210) on socket substrate (e.g. 155 on test platform 200, or 175), step 350. In various embodiment, since singulated devices may be very small (e.g. 1.1 mm×1.1 mm or even smaller), the amount of force or impact applied by first pick and place tool 170 on a singulated device should be controlled. In various embodiments, the location of the picked singulated device and the location of the open socket where it is placed is maintained in a memory of controller 130, step 360. The process herein may be repeated, step 370, until there are no more open sockets on test platform 200; until all known good devices are removed from adhesive backing material 170; until the operator is satisfied; or until any metric is satisfied. In some embodiments, socket substrate (e.g. 155 or 175) is then mounted on test platform 200.

In various embodiments, the singulated devices 165 that are selected from the diced wafer may be all within a specific region of diced wafer 150 (e.g. within a specific square or rectangular region); singulated devices 165 may be selected from different regions of a diced wafer (e.g. some from a top region, some from a left region, some from a right region, and some from a bottom region of a diced wafer 150); singulated devices 165 may be randomly selected; or any combination of the above. In still other embodiments, other methodologies for picking singulated devices may be used, such as: an onion selection, a surrounding rule, a category rule, a block rule, a target die to block rule, a 5/9 point rule, an odd/even row or column rule, an N×N square block rule, an ugly map rule, or the like. In various embodiments, the locations of singulated devices that are selected are maintained in a memory of controller 130, as well as whether they pass or which bin they are placed into. Such data may be used to determine if there are process variations or the like that are causing singulated devices within one or more regions of wafers to have devices of lower quality, or the like.

In various embodiments, a testing phase begins with controller 130 applying electrical signals to singulated devices 165, step 380. In some examples, the electrical signals may include power signals; may include writing specific data into registers of singulated devices 165 to put such devices into particular modes; or the like. In various embodiments, the electrical signals are provided to singulated devices 165 via multiple sockets 210, as discussed above. The testing phase may include controller 130 controlling rate table 180 to apply forces to singulated devices, step 390. In various embodiments, one or more test routines may be included in a program memory of controller 130 that specifies the types of motion desired for rate table 180, the profiles of the motions, the durations of the motions, or combinations thereof. In other embodiments, rate table 180 may have test routines stored or programmed therein, that are executed in response to one or more instructions of controller 130. As mentioned above, typical motions for rate table 180 may include independently controlled movement in the x, y and z-axis, independently controlled rotations in the x, y and z-axis, and combinations thereof.

Additional accessories may be provided within testing station 120 to provide other types of force testing of singulated devices 165. For example, rate table 180 may be disposed in a pressure chamber that can apply a positive pressure or negative pressure to singulated devices; rate table 180 may be disposed in an oven that can apply a range of temperatures to singulated devices 165 (e.g. from 100 C to −20 C, or the like); a magnetic field source may be disposed near rate table 180 to provide a localized magnetic field; and the like. In light of the present disclosure, it is believed that one of ordinary skill in the art will recognize many other types of accessories that may be included to test other aspects of singulated devices 165.

In various embodiments, while the forces are being applied to singulated devices 165 and/or after the forces are completed, controller 130 collects and stores test data from the singulated devices 165, step 400. In some examples, controller 130 may receive raw test data such as acceleration data, gyroscopic rotation data, magnetic field data, pressure data, and the like from singulated devices 165. In other examples, controller 130 may access register data from singulated devices 165 that are associated with performance data of singulated devices 165, such as the results of internal self-test modes, stiction indicators, and the like. Still other examples may include combinations of the above data. In some embodiments, the data may be stored into a memory of controller 130.

In some embodiments, the testing phase completes with controller 130 comparing the test data collected above to one or more performance thresholds, step 410. In various embodiments, this may include comparison of test data to thresholds for all of the MEMS devices within a singulated device meeting performance thresholds appropriate for the respective MEMS devices. In some embodiments, if one or more of the MEMS devices within a singulated device to not meet appropriate performance thresholds, the singulated device may be associated with a fail condition. In other embodiments, if more than one set of performance thresholds are used (e.g. high performance, low performance, unacceptable performance, etc.) for MEMS devices within a singulated device, controller 130 may designate an appropriate category, e.g. a high performance category, a low performance category, a discard category, or the like for each singulated device.

In various embodiments, the results of the comparisons may be stored in a memory of controller 130, step 420. Typically, the comparison results are associated in the memory along with an identifier of the diced wafer and a singulated device location within the diced wafer, the socket location, and the like. Such data may be useful in identifying defects in the semiconductor manufacturing process. Next, based upon the comparison results, a determination is made as to destinations for the singulated devices 165, step 430. As discussed above, the destination may include packaging within a first transport tape reel, a second transport tape reel, a disposal bin, or the like.

In various embodiments, after the testing phase completes, controller 130 directs second pick and place tool 190 to pick up a singulated device from a socket (e.g. from socket substrate 155 on test platform 200, socket substrate 185), step 440. In some embodiments, the end of the testing phase may include unmounting socket substrate 185 from test platform 200). Next, based upon the performance comparison results, controller 130 directs second pick and place tool 190 to place the singulated device in an appropriate location, step 450. For example, for A failing part, second pick and place tool 190 may place the singulated device in a disposal bin; for a passing part, second pick and place tool 190 may place the singulated device in a first transport tape media, a second transport tape media, or the like. Subsequently, the controller 130 may direct tape and reel station 140 to seal the singulated device within the first transport tape media and to rotate a reel, step 460. In various embodiments, for parts that do not pass, controller 130 directs pick and place tool 190 to pick up a singulated device from a socket on test platform 200, step 480, and to place the singulated device in a disposal bin (or alternative destination, e.g. a different transport tape media), step 490.

In various embodiments, the second pick and place tool 190 may repeat the above process until each of singulated devices 165 have been removed from socket substrate 155 on test platform 200 or socket substrate 185, step 470. Additionally, the above processes may be repeated until all known good singulated devices are removed from a diced wafer, until the operator is finished, until a transport tape media is full, or the like. In some embodiments, when the transport tape media reel is full, the reel may be packaged.

Figure 3:
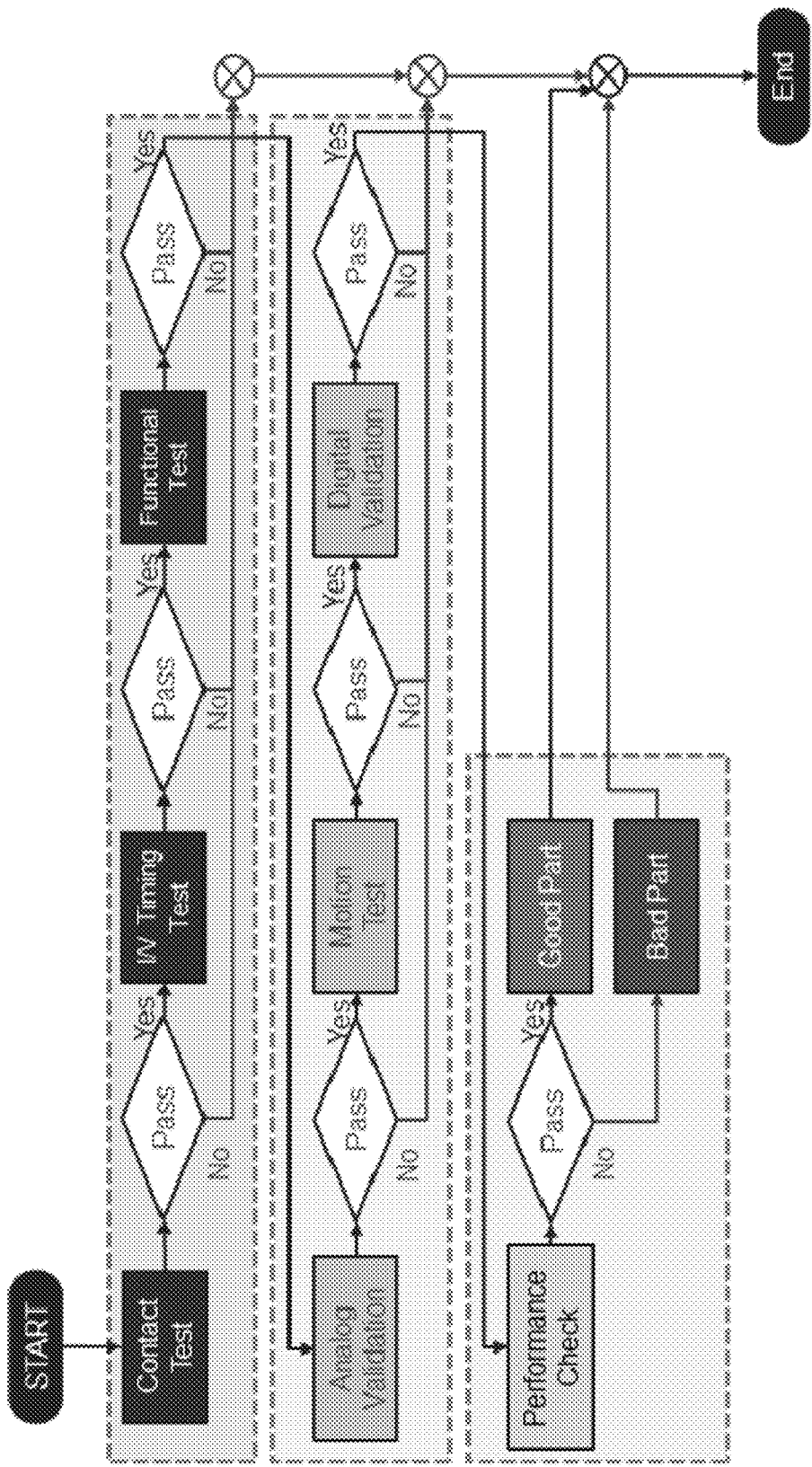
FIG. 3 illustrates a flow diagram of methods according to various embodiments of the present invention.

FIG. 3 illustrates an example of an implementation of steps 380-420 of FIGS. 2A-C. In particular, an initial contact phase is performed to test whether there are any open or shorts in the circuitry; whether the singulated device 165 is socketed properly; whether the wire bonds are connected correctly; and the like. Next a current/voltage (I/V) voltage phase is performed to test current regulators; voltage regulators, frequency response; and the like. A functional phase is then performed to test the functional logic circuitry of a device, e.g. via setting registers. In various embodiments, an analog validation phase tests the analog portion of the device for proper performance. A Motion test is then performed that places the devices under physical stress, e.g. rotation, acceleration, motion testing, pressure testing, temperature testing, and the like, as discussed herein. A digital validation phase tests the digital portion of the device for proper operation. A performance check phase also is used in some embodiments to perform additional physical stresses on the device. As illustrated in the embodiments in FIG. 3, if any of these tests fail, the device may be considered a failing part or a sub performance part. In some embodiments, parts meeting lower performance thresholds, but not higher performance thresholds, may be placed in lower performance bins and still be considered a good part. It should be understood that the order of test phases, as well as the numbers and types of test phases may be increased or decreased, in various embodiments of the present invention.

Figure 4:
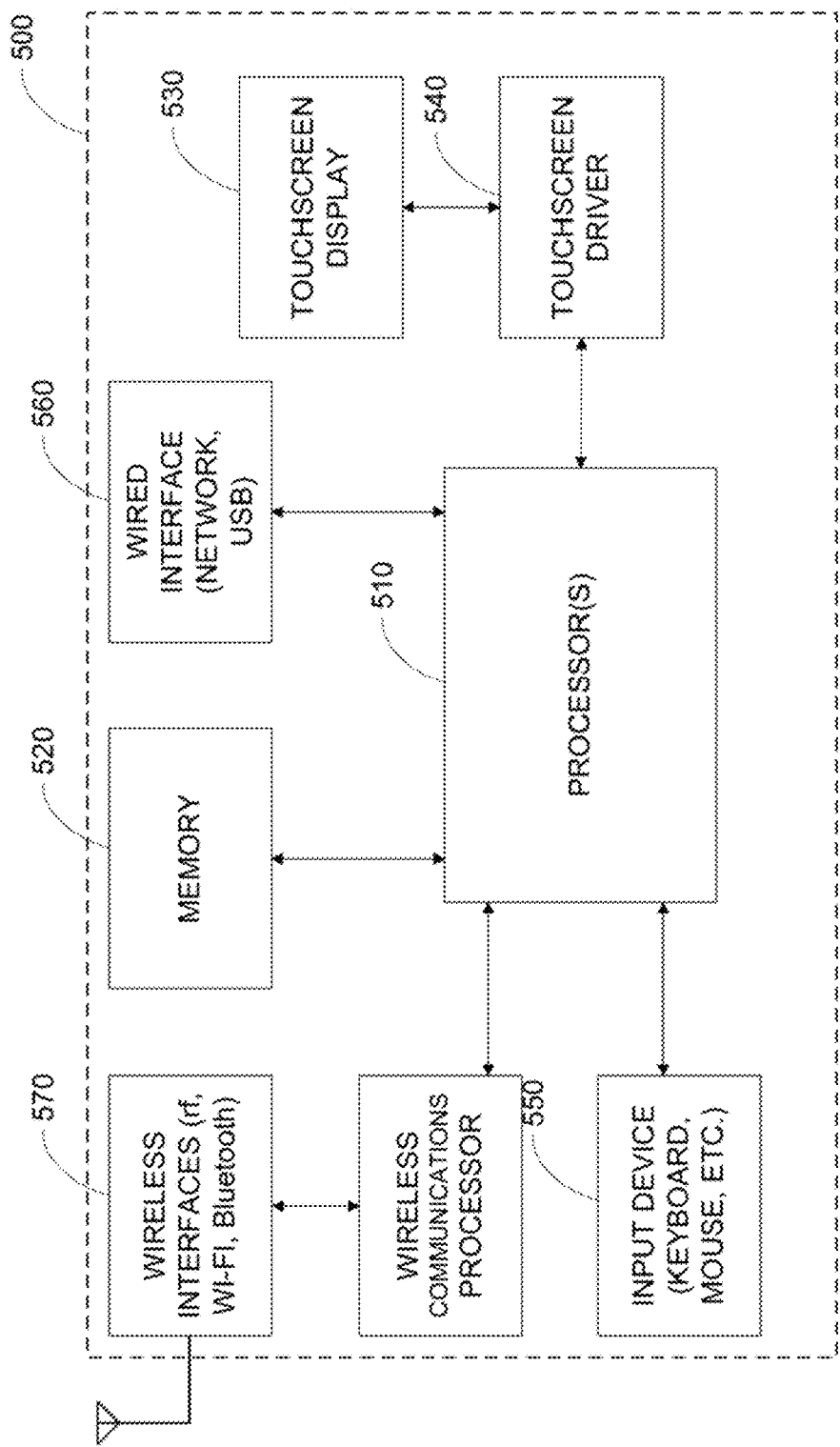
FIG. 4 is a block diagram of an embodiment of the present invention.

FIG. 4 illustrates a functional block diagram of various embodiments of the present invention for controlling the system, e.g. one or more portions of system 100. In FIG. 4, a computing device 500 typically includes a processor 510, a memory 520, a display 530 and driver 540, an input device 550, a wired interface 560, a wireless interface 570, or the like.

Typically, computing device 500 may include one or more processors 510. Such processors 510 may include one or more processing cores. Processors 510 may be a processor from Apple, Intel, AMD, TI, or the like. In various embodiments, the processor core may be a processor based upon an IP core from ARM Holdings, MIPS, or the like. It is contemplated that other existing and/or later-developed processors may be used in various embodiments of the present invention. These processors may be programmed to execute the processes described herein, for example, FIGS. 2A-C and FIG. 3.

In various embodiments, memory 520 may include different types of memory (including memory controllers), such as flash memory (e.g. NOR, NAND), pseudo SRAM, DDR SDRAM, or the like. Memory 520 may be fixed within computing device 500 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data, test result and position data, or the like. It is contemplated that other existing and/or later-developed memory and memory technology may be used in various embodiments of the present invention.

In various embodiments, display 530 and driver 540 may be based upon a variety of later-developed or current touch screen technology including resistive displays, capacitive displays, optical sensor displays, electromagnetic resonance, or the like. In some embodiments of the present invention, a display output port, such as an HDMI-based port or DVI-based port may also be included.

In various embodiments, user input device 550 may include a keyboard, a keypad, a mouse, a joystick, a knob, a touch screen, a series of switches, or the like.

In various embodiments, wired interface 560 may be used to provide data transfers between computing device 500 and an external source, such as another computer, a remote server, a storage network, the pick and place tools, the testing platform, a tape and reel platform, or the like. Such data may include application data, operating system data, firmware, instruction data, or the like. Embodiments may include any later-developed or conventional physical interface/protocol, such as: USB, micro USB, mini USB, Firewire, Apple Lightning connector, Ethernet, POTS, or the like. In some embodiments, proprietary interfaces may also be used. Additionally, software that enables communications over such networks is typically provided.

In various embodiments, wireless interface 570 may be provided to provide wireless data transfers between computing device 500 and external sources, such as computers, storage networks, peripherals, or the like, as discussed above. In FIG. 4, wireless protocols may include Wi-Fi (e.g. IEEE 802.11 a/b/g/n, WiMax), Bluetooth, IR, near field communication (NFC), ZigBee, RF and the like.

In various embodiments, any number of future developed or current operating systems may be supported, such as UNIX, Windows, and the like. In various embodiments of the present invention, the operating system may be a multi-threaded multi-tasking operating system. Accordingly, inputs and/or outputs from pick and place tool, or the like may be processed in parallel processing threads. In other embodiments, such events or outputs may be processed serially, or the like.

FIG. 4 is representative of one computing device 500 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 4. Further, it should be understood that multiple functional blocks may be embodied into a single physical package or device, and various functional blocks may be divided and be performed among separate physical packages or devices.

Further embodiments can be envisioned to one of ordinary skill in the art after reading this disclosure. In other embodiments, combinations or sub-combinations of the above disclosed invention can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed:

1. A method comprising:
receiving in a receiving stage, a diced wafer having a plurality of integrated devices comprising CMOS and MEMS devices disposed upon an adhesive substrate, wherein the diced wafer is associated with a known good device data associated with the plurality of integrated devices;
removing with a first pick and place device, a first set of integrated devices from the plurality of integrated devices from the adhesive substrate in response to the known good device data;
placing with the first pick and place device, the first set of integrated devices into a plurality of sockets within a socket substrate;
testing with the testing platform, the first set of integrated devices comprising:
while physically stressing with the testing platform, the first set of integrated devices, providing with the plurality of sockets, electrical power to the first set of integrated devices and receiving with the plurality of sockets, electrical response data from the first set of integrated devices;
determining with a processing unit coupled to the testing platform, a second set of integrated devices from the first set of integrated devices, in response to the electrical response data;

removing with a second pick and place device, the second set of integrated devices from the plurality of sockets within the first substrate; and disposing the second set of integrated devices into a transport tape media.

2. The method of claim 1 wherein a number of integrated devices from the second set of integrated devices is equal to or less than a number of integrated devices from the first set of integrated devices.

3. The method of claim 1 physical stressing the first set of integrated devices comprises shaking the first set of integrated devices; and wherein the shaking comprises shaking the testing platform in a direction selected from a group consisting of: x-direction, y-direction, z-direction, x-y-direction, x-z-direction, and y-z direction.

4. The method of claim 1 physical stressing the first set of integrated devices comprises rotating the first set of integrated devices; and wherein the rotating comprises rotating the testing platform along an axis selected from a group consisting of: x-axis, y-axis, z-axis, x-y-axis, x-z-axis, and y-z axis.

5. The method of claim 1 wherein the MEMS devices are selected from a group consisting of: an accelerometer, a gyroscope, a magnetometer and a pressure sensor.

6. The method of claim 1 wherein the determining the second set of integrated devices comprises:

comparing with the processing unit the electrical response data from the first set of integrated devices against threshold data to determine comparison data; and determining with the processing unit, the second set of integrated devices from the first set of integrated devices, in response to the comparison data.

7. The method of claim 6 wherein the comparison data indicates a stiction condition associated with an integrated device from the first set of integrated devices.

8. The method of claim 6 wherein the comparison data indicates an out of range condition associated with an integrated device from the first set of integrated devices.

9. The method of claim 6 wherein the comparison data indicates a ringing condition associated with an integrated device from the first set of integrated devices.

10. The method of claim 1 removing with the second pick and place device, remaining integrated devices from the first set of integrated devices not within the second set of integrated devices from the socket substrate; and placing the remaining integrated devices into a disposal region.

* * * * *